United States Patent [19]

Park et al.

[11] Patent Number: 5,053,298

[45] Date of Patent: Oct. 1, 1991

[54] METHOD OF MANUFACTURING COLOR FILTER INCLUDING EXPOSING PLANARIZING LAYER THROUGH OPENINGS IN A MEDIUM LAYER

[75] Inventors: Han-su Park, Kyunggi; Hyeong-seok Lee, Seoul; Deok-ki Jeong, Kwacheon, all of Rep. of Korea

[73] Assignee: Samsung electronics Co., Ltd., Kyunggi, Rep. of Korea

[21] Appl. No.: 491,101

[22] Filed: Mar. 9, 1990

[30] Foreign Application Priority Data

Dec. 2, 1989 [KR] Rep. of Korea ................... 89-17828

[51] Int. Cl.$^5$ .......................... G03F 9/00; G02B 5/22
[52] U.S. Cl. .......................................... 430/7; 359/891
[58] Field of Search ................ 350/317, 320; 358/44; 430/7; 427/162

[56] References Cited

U.S. PATENT DOCUMENTS

| | | | |
|---|---|---|---|
| 4,029,394 | 6/1977 | Araki | 350/317 |
| 4,271,246 | 6/1981 | Sato et al. | 350/317 |
| 4,383,018 | 5/1983 | Martin et al. | 350/317 |
| 4,580,159 | 4/1986 | Manabe | 350/317 |
| 4,709,990 | 12/1907 | Oana | 350/317 |
| 4,786,148 | 11/1908 | Sekimura et al. | 350/317 |
| 4,786,819 | 11/1988 | Tei | 430/7 |
| 4,830,941 | 5/1989 | Roosen et al. | 350/317 |
| 4,934,791 | 6/1990 | Shimizu et al. | 350/317 |

FOREIGN PATENT DOCUMENTS

| | | | |
|---|---|---|---|
| 188104 | 8/1988 | Japan | 350/317 |
| 276003 | 11/1988 | Japan | 350/317 |

*Primary Examiner*—Jon W. Henry
*Attorney, Agent, or Firm*—Morgan & Finnegan

[57] ABSTRACT

A color filter and manufacturing method thereof are provided which can improve the optical transmittance and diminish the dispersion phenomena due to the diffraction and reflectance of incident light. The color filter has at least two mutually different filtering characteristics respectively corresponding to the plural pixels placed in a matrix on the background substrate. The color filter includes a planarizing layer, a color filter pattern, a coloring layer and a protective layer. The method for manufacturing the color filter involves forming a planarizing layer, a color filter pattern, and a protective layer.

10 Claims, 3 Drawing Sheets

METHOD OF MANUFACTURING COLOR FILTER INCLUDING EXPOSING PLANARIZING LAYER THROUGH OPENINGS IN A MEDIUM LAYER

FIELD OF THE INVENTION

The present invention relates to a color filter used in solid state image sensing devices and display devices. More particularly, the invention relates to a color filter and a manufacturing method therefor for improving the optical transmittance and diminishing the dispersion phenomena due to the diffraction and reflectance of incident light.

BACKGROUND OF THE INVENTION

Recently, coloring of solid state image sensing devices (which are being heralded as the image sensing devices of the next generation, taking the place of electron tubes and image sensing tubes) is being performed by forming a color filter in the upper part of a photoelectric conversion region. Similarly, the coloring of a display device such as a liquid crystal display device is being performed by forming a color filter in the upper part of a photoelectric conversion region.

The kinds of color filters are classified into an organic filter colored with organic matter such as gelatin or with another coloring agent, and an inorganic filter which uses optical interference. Among the filters mentioned above, the organic filter is more widely used than the inorganic filter due to its lower cost.

FIG. 1 is a cross sectional drawing illustrating a color filter for a prior art Charge Coupled Device (CCD). In FIG. 1, the silicon substrate 1 whose surface is concave and convex, has photo diode arrays 2,3,4 formed at the surface of the concave region, and a conducting layer 5 and an insulating layer 6 formed at the surface of the convex region.

Among the conducting layers 5, a section is used in pad for the electrical connection between the semiconductor device and the package, and the insulating layers 6 are used in the electrical insulation of the photo diode arrays 2,3,4.

The manufacturing process for the embodiment of the above-mentioned structure is explained briefly as follows. In the silicon substrate 1 whose surface is concave and convex, photo diode arrays 2,3,4 are formed at the surface of the concave region, and a conducting layer 5 and an insulating layer 6 are formed at the surface of the convex region. A planarizing layer 7 is applied on the surface of the silicon substrate 1 by a transparent agent such as a polyimide.

Thereafter, a photosensitive agent such as casein or gelatin mixed with ammonium dichromate is applied in the upper region of the planarizing layer 7 and a color filter pattern 8 is formed by photo lithography.

Next, a coloring agent is applied in the planarizing layer 7 and the color filter pattern 8. Then, a coloring layer 9 is formed by coloring only the color filter pattern 8. The coloring layer 9 is colored with any one of the coloring agents such as magenta, cyan or yellow in order to filter any one of the colored lights magenta, cyan or yellow.

Thereafter, a medium layer 11 is formed by applying polyimide at the surface of the above-mentioned structure. In a manner similar to that outlined above, color filter patterns 13, 19, and coloring layers 15, 21, which can filter the respective desired color at the surface of the color filter patterns 13, 19 and the medium layers 11 and 17, are formed. The medium layers 11, 17 prevent the coloring layers from being mixed with each other. Next, a protective layer 23 is formed over the entire surface of the above-mentioned structure by applying polyimide, and a portion of the pad 5 is then exposed by forming an opening 25 for an electrode.

Another prior color filter is shown in Republic of Korea Patent Publication 83-1454. The color filter therein described has the problem that its picture quality is inferior due to the dispersion phenomena brought about by the diffraction and reflectance of incident light. Picture quality is also degraded by the reduction of optical transmittance by the medium layers, as the color filter layers corresponding to the photoelectric cell arrays are formed at respectively different heights and the medium layers are thickened upon being laminated. The prior art device also has difficulty in fashioning the opening for the electrode.

SUMMARY OF THE INVENTION

It is therefore an object of the present invention to provide an improved color filter which overcomes the shortcomings of the prior art device as described above and can thus provide good picture quality.

It is another object of the present invention to provide a method of manufacturing the color filter which overcomes the problems of the prior art.

To accomplish these and other objects of the invention, the present invention provides a color filter having at least two mutually different filtering characteristics respectively corresponding to the plural pixels placed in a matrix on the background substrate. The color filter has a planarizing layer which transmits light along substantially the entire surface of the background substrate. At least one color filter pattern, and preferably more, is formed in the upper region of the planarizing layer corresponding to each pixel. If two or more color filter patterns are formed, then each is formed at substantially the same height on the planarizing layer. A coloring layer is applied to the surface of each respective color filter pattern. Each respective coloring layer is colored with a different color. A protective layer which transmits light along substantially the entire surface of the planarizing layer and the coloring layer(s) is then formed.

Also provided as part of the present invention is a method for manufacturing a color filter having at least two mutually different filtering characteristics respectively corresponding to the plural pixels placed in a matrix on the background substrate. The planarizing layer which transmits light along substantially the entire surface of the background surface is formed first. Secondly, color filter patterns corresponding to the pixels are formed on the planarizing layer. The color filter patterns are placed at substantially the same height relative to one another. Next, coloring layers are formed at the surface of these color filter patterns. The coloring layers are selectively colored with a different color. A protective layer which transmits light along substantially the entire surface of the planarizing layer and the coloring layers is then formed.

BRIEF DESCRIPTION OF THE DRAWINGS

The above objects and other advantages of the present invention will become more apparent by describing the preferred embodiments of the present invention with reference to the attached drawings in which.

DETAILED DESCRIPTION OF THE DRAWINGS

Figure 1:
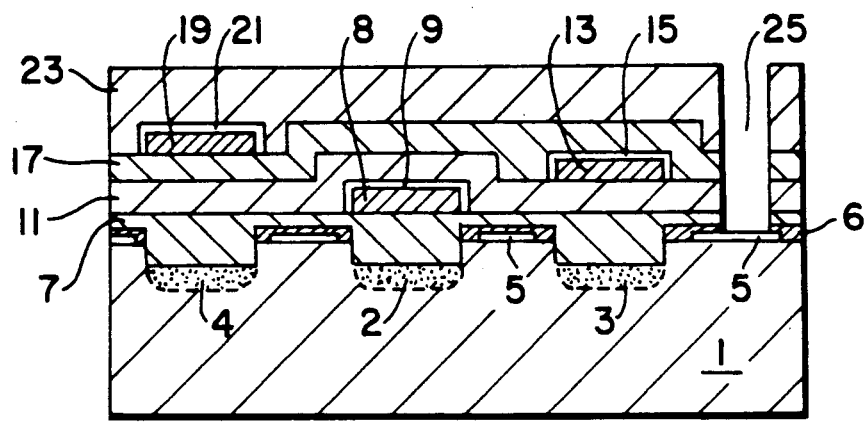
FIG. 1 is a cross-sectional drawing of a prior art color filter.
Figure 2:
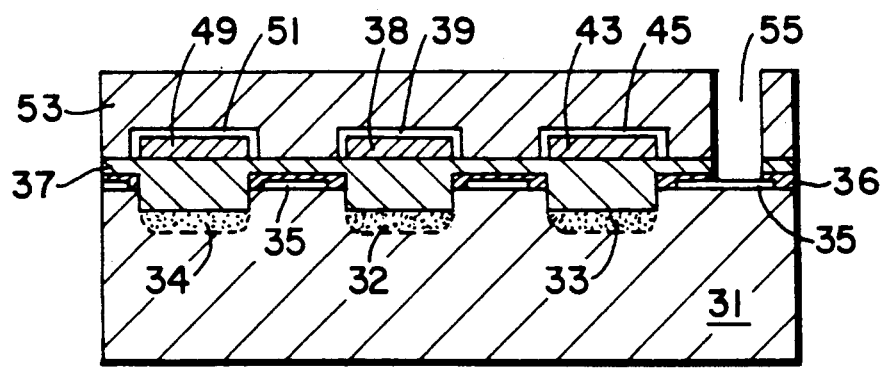
FIG. 2 is a cross sectional drawing of a color filter according to the present invention.

FIG. 2 is a vertical cross-sectional drawing illustrating a color filter in accordance with the present invention as applied to a Charge Coupled Device (CCD). However, the invention is not limited to CCD devices and adaptation of the color filter to other solid state image sensing devices and display devices is certainly within the scope of the invention.

In FIG. 2, a silicon substrate 31 which is both concave and convex has photo diode arrays 32,33,34 (which play a role in the pixels) formed at the surface of the concave region, and a conducting layer 35 for connection and an insulating layer 36 formed at the surface of the convex region. Some of the conducting layer 35 is used to electrically connect the semiconductor device with the package, and the insulating layer 36 is used to electrically separate the photo diodes 32,33,34. A planarizing layer 37 is also formed on substantially the entire surface of the silicon substrate 31.

Color filter patterns 38, 43, 49, whose surfaces are respectively occupied by the coloring layers 39, 45, 51, are formed in the upper region of the planarizing layer 37 corresponding to the photo diode arrays 32, 33, 34. The color filter patterns 38, 43, 49 are formed at substantially the same height for the photo diode arrays 32, 33, 34.

A protective layer 53 is applied on substantially the entire surface of the planarizing layer 37 and coloring layers 39, 45, 51. An opening is formed to fit an electrode on the pad 35.

FIGS. 3A-3E are cross sectional drawings showing the manufacturing process for the color filter embodied in FIG. 2.

Figure 3A:
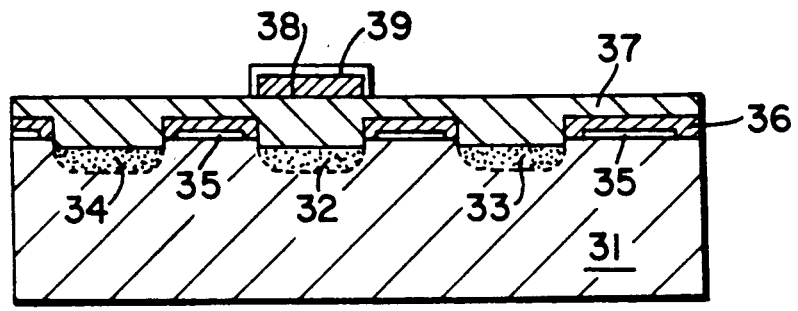
FIGS. 3A-3E are cross sectional drawings illustrating a manufacturing process for the color filter illustrated in FIG. 2.

Referring to FIG. 3A, the surface of the silicon substrate 31 is a concave-convex structure, in which photo diode arrays 32,33,34 are formed at the surface of the concave region. A conducting layer 35 made up of a metal such as Al and an insulating layer 35 such as $SiO_2$ are formed at the surface of the convex region.

Next, a planarizing layer 37 is formed on the silicon substrate 31 by applying a transparent agent such as a polyimide, which is inherently photosensitive. In order to transmit incident light above 95%, the planarizing layer 37 is formed by applying a thickness of about 3000 A as measured from the convex region.

Thereafter, after applying to the surface of the planarizing layer 37 casein or gelatin mixed with dichromate acid in a thickness of about 4000-10000 A, a first color filter pattern 38 is formed by photolithography. The first color filter pattern 38 corresponds to the first photo diode 32.

Next, by continuously applying a coloring agent to the surface of the planarizing layer 37, the surface of the first color filter pattern 38 is colored, thereby forming a first coloring layer 39. The coloring agent on the planarizing layer 37 is removed by deionized water. Any one of the coloring agents such as magenta, cyan or yellow is used as the coloring agent so that it may filter any one of the colored lights such as magenta, cyan or yellow. For example, magenta is used as a coloring agent so that the first coloring layer 38 may filter magenta-colored light.

Figure 3B:
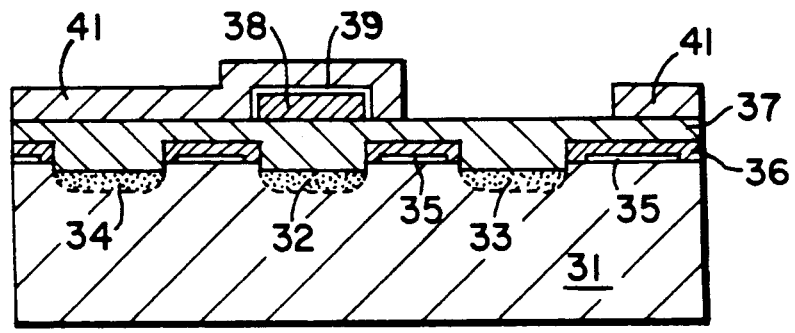

Referring now to FIG. 3B, by applying polyimide to the upper region of the planarizing layer 37 and the first coloring layer 39 in a thickness of about 1 μm first medium layer 41 is formed. Then the planarizing layer 37 on the second photo diode 33 is exposed by a photolithography method so that a first medium layer 41 with a partial opening is formed.

The planarizing layer 37 and the first medium layer 41 are formed by respectively different agents or by the same agent. In the case of the same agent, when forming the first medium layer 41, thermal energy is applied after forming the planarizing layer 37 so that the planarizing layer is not exposed. That is, the planarizing layer is formed using a softbake process at a relatively high temperature so it hardens and will resist etching. The planarizing layer is thus harder than the first medium layer. The first medium layer may also be subjected to a softbake process, but at a relatively lower temperature so that it can later be removed.

When the planarizing layer 37 and the first medium layer 41 are formed by respectively different agents, the planarizing layer 37 and the first medium layer 41 are exposed by lights of respectively different wavelengths. The planarizing layer 37 is sufficiently exposed in order to planarize the layer to be formed thereafter.

Figure 3C:
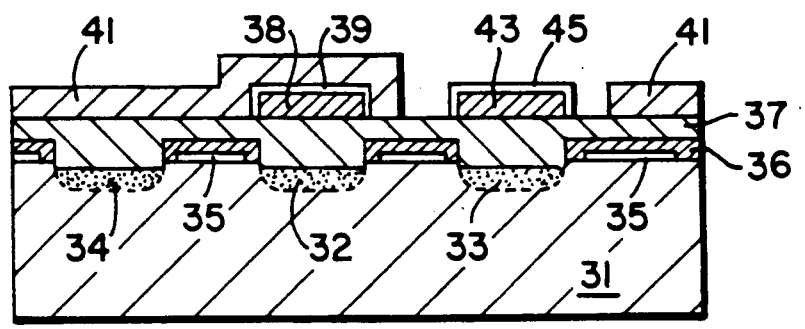

Referring now to FIG. 3C, a second color filter pattern 43 is formed by a method and an agent similar to the first color filter pattern 38. The second color filter pattern 43 corresponds to the second photo diode 33.

Next, a second coloring layer 45 is formed on the surface of the second color filter pattern 43 by the method similar to the formation of the first coloring layer 39. The first medium layer 41 prevents the coloring agent used for forming the second coloring layer 45 from being mixed with the first coloring layer 39. Cyan is used as the coloring agent so that the second coloring layer 45 may filter the cyan-colored light.

Figure 3D:
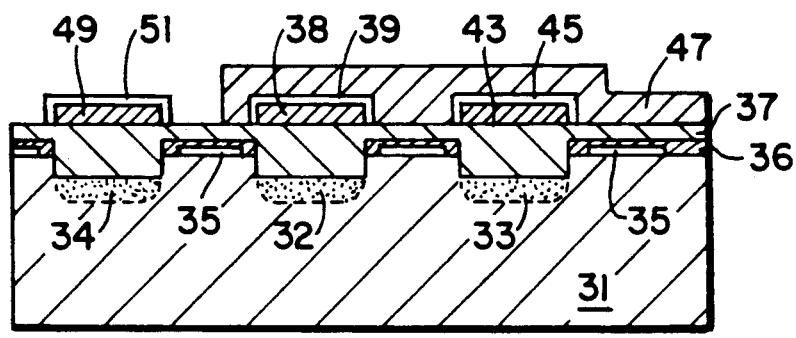

Referring now to FIG. 3D, after the coloring agent on the first medium layer 41 is removed by deionized water, the first medium layer is developed or is removed by thinner or stripper. A second medium layer 47 is then formed in a similar manner to that described for the first medium layer. The planarizing layer 37 on the third photo diode 34 is then exposed by photolithography. A third color filter pattern 49 and a third coloring layer 51 are formed by the method described above. The third color filter pattern corresponds to the third photo diode 34. Yellow is used as the coloring agent so that the third coloring layer 51 may filter the yellow-colored light.

Figure 3E:
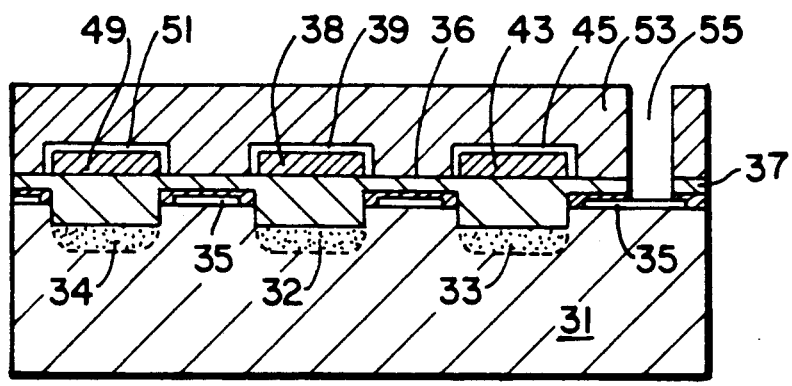

Referring now to FIG. 3E, after removing the coloring agent on the second medium layer 47 by deionized water, the second medium layer 47 is removed by the aforementioned method utilized for removing the first medium layer 41. Thereafter, after a protective layer 53 is applied with polyimide at substantially the entire surface of the above-mentioned structure in a thickness of about 1 μm, an opening 55 is formed for the electrode, thereby exposing a section of the pad 35.

As described above, because all the coloring layers corresponding to the photoelectric device arrays are placed at substantially the same height the dispersion phenomena due to the diffraction and reflectance of incident light can be prevented. Additionally, because there are no medium layers for preventing the colors from being mixed with each other in applying the coloring agent, the optical transmittance can be improved and the opening process for forming the electrode can be greatly facilitated.

Thus, the present invention has the advantage of improving the optical transmittance, improving the picture quality of the color filter image, and also facilitating the manufacturing process therefor by substantially eliminating the dispersion phenomena as a result of the diffraction and reflectance of incident light.

The invention is not limited to the specific embodiments herein shown and described. Departures may be made therefrom within the scope of the accompanying claims, without departing from the principles of the invention and without sacrificing its chief advantages.

What is claimed is:

1. In a method for manufacturing a color filter which has a plurality of light receiving regions disposed in the form of a matrix on a substrate, said substrate having a plurality of electrodes formed between said light receiving regions in the column direction of the matrix, said color filter having a plurality of coplanar color pattern groups which overlap with said light receiving regions, said method comprising the steps of:

coating a transparent planarizing layer on the surface of said substrate to flatten the surface of said substrate;

forming on said planarizing layer a first relief pattern overlapping said light receiving region, corresponding to a first color;

coloring said first relief pattern with said first color;

forming a medium layer to prevent coloring, said medium layer covering the whole surface of the structure resulting after said coloring step;

forming openings for exposing said planarizing layer;

forming a new relief pattern within said opening, said relief pattern overlapping another light receiving region;

coloring said relief pattern with a color different from said first color;

removing said medium layer;

forming colored relief patterns with different colors by successively repeating said steps of forming a medium layer, forming openings, forming a new relief pattern overlapping a light receiving region, coloring the newly formed relief pattern, and removing said medium layer; and coating a protective layer on the whole surface of the resultant structure after forming the colored pattern for the last desired color.

2. A method of manufacturing a color filter as recited in claim 1, wherein said relief patterns are formed by casein or gelatin mixed with dichromate acid.

3. A method for manufacturing a color filter as recited in claim 1, wherein said planarizing layer and said medium layers are formed by photosensitive resin.

4. A method for manufacturing a color filter as recited in claim 1, wherein said planarizing layer and said medium layers are formed by the same resin.

5. A method for manufacturing a color filter as recited in claim 1, wherein said planarizing layer is formed by applying thermal energy thereto.

6. A method for manufacturing a color filter as recited in claim 3, wherein said planarizing layer and said medium layer are formed by material photosensitive to lights of different wavelengths.

7. A method for manufacturing a color filter as recited in claim 3, wherein said medium layers are removed by developing after flood expose.

8. A method for manufacturing a color filter as recited in claim 3, wherein said medium layers are removed by thinner or stripper.

9. A method for manufacturing a color filter as recited in claim 3, wherein said respective relief patterns corresponding to said colored patterns are formed by coloring with magenta, cyan and green colors respectively.

10. A method for manufacturing a color filter as recited in claim 1, wherein said respective relief patterns corresponding to said colored patterns are formed by coloring with blue, red and yellow colors respectively.

* * * * *